(12) United States Patent
Chu et al.

(10) Patent No.: US 11,099,665 B2
(45) Date of Patent: Aug. 24, 2021

(54) CONTROL KNOB FOR CONTROLLING OPERATION OF A MACHINE

(71) Applicants: Dongguan Chen Da Appliance Co. Ltd, Guangdong (CN); Defond Components Limited, Chai Wan (HK)

(72) Inventors: Wai Cheong Wilson Chu, Chai Wan (HK); Tak Chuen Richard Or, Chai Wan (HK)

(73) Assignee: Defond Electech Co., Ltd., Guangdong (CN)

( * ) Notice: Subject to any disclaimer, the term of this patent is extended or adjusted under 35 U.S.C. 154(b) by 0 days.

(21) Appl. No.: 16/746,173

(22) Filed: Jan. 17, 2020

(65) Prior Publication Data

US 2020/0150786 A1 May 14, 2020

Related U.S. Application Data

(63) Continuation of application No. 15/808,072, filed on Nov. 9, 2017, now Pat. No. 10,649,556.

(30) Foreign Application Priority Data

Dec. 9, 2016 (HK) .................................. 16114084.0

(51) Int. Cl.
*B60K 37/04* (2006.01)
*B60K 37/06* (2006.01)
(Continued)

(52) U.S. Cl.
CPC ............ *G06F 3/0362* (2013.01); *B60K 37/06* (2013.01); *G06F 3/0383* (2013.01);
(Continued)

(58) Field of Classification Search
CPC .............. B60K 37/06; B60K 2350/102; B60K 2350/104; B60K 2350/106;
(Continued)

(56) References Cited

U.S. PATENT DOCUMENTS 4,131,033 A * 12/1978 Wright .................... G05G 1/02
200/316
4,173,941 A 11/1979 Castagna
(Continued)

FOREIGN PATENT DOCUMENTS

CN 102202928 A 9/2011
CN 202217631 U 5/2012
(Continued)

OTHER PUBLICATIONS

Chinese Patent Office Patentability Search Report based on the claims of the priority application HK 16114084.0, dated Dec. 15, 2016, 7 pages.
(Continued)

*Primary Examiner* — Michael J Eurice
(74) *Attorney, Agent, or Firm* — Ohlandt, Greeley, Ruggiero & Perle, L.L.P.

(57) ABSTRACT

A control button for controlling operation a machine including: an attachment member for attaching the control button to the machine; a display member including an electronic display module; an operational mode display controller for controlling display of operational modes of the machine upon the electronic display module, the operational mode display controller being operably connected with the electronic display module so that, in response to the operational mode display controller, the electronic display module is configured to display a plurality of operational modes of the machine; and an operational mode selector for controlling selection of one of the operational modes of the machine when one of the operational modes are displayed on the electronic display module, the operational mode selector being configured for movement between at least a first position and a second position to actuate selection of the
(Continued)

operational mode displayed on the electronic display module.

15 Claims, 6 Drawing Sheets

(51) Int. Cl.
G06F 3/0362 (2013.01)
H03K 17/96 (2006.01)
H01H 25/06 (2006.01)
H01H 9/18 (2006.01)
G06F 3/038 (2013.01)
G06F 3/0354 (2013.01)
G06F 3/0482 (2013.01)
G06F 3/0488 (2013.01)
H01H 13/52 (2006.01)
G06F 3/01 (2006.01)
G06F 3/16 (2006.01)

(52) U.S. Cl.
CPC ........ *G06F 3/03547* (2013.01); *G06F 3/0482* (2013.01); *G06F 3/0488* (2013.01); *H01H 9/181* (2013.01); *H01H 25/065* (2013.01); *H03K 17/96* (2013.01); *B60K 2370/126* (2019.05); *B60K 2370/128* (2019.05); *B60K 2370/1438* (2019.05); *B60K 2370/152* (2019.05); *B60K 2370/1537* (2019.05); *G06F 3/016* (2013.01); *G06F 3/167* (2013.01); *H01H 25/06* (2013.01); *H01H 2013/525* (2013.01)

(58) Field of Classification Search
CPC .... B60K 2350/1028; B60K 2350/1032; B60K 2350/1036; B60K 2350/2004; B60K 2350/352; B60K 2350/403; B60R 1/04; B60R 11/02; B60R 11/04; B60R 2001/1223; B60R 2011/001; B60R 2011/0059; B60R 2011/0288; G06F 3/016; G06F 3/167; G06F 3/02; G06F 3/0312; G06F 3/03547; G06F 3/0362; G06F 3/041; G06F 3/0482; G06F 3/0488; G05G 1/02; G05G 1/08; G05G 1/10; G05G 5/03; G05G 9/047; G05G 2009/0477; H01H 25/06; H01H 25/065; H01H 9/181; H01H 2013/525; H01H 2025/045; H03K 17/96

See application file for complete search history.

(56) References Cited

U.S. PATENT DOCUMENTS

| | | | |
|---|---|---|---|
| 4,467,961 A | 8/1984 | Coffee | |
| 4,553,702 A | 11/1985 | Coffee | |
| 4,580,721 A | 4/1986 | Coffee | |
| 6,154,201 A * | 11/2000 | Levin | G01C 21/3664 345/156 |
| 6,438,241 B1 * | 8/2002 | Silfvast | H04H 60/04 381/119 |
| 6,577,120 B2 * | 6/2003 | Oomkes | G01D 5/145 324/207.2 |
| 6,636,197 B1 * | 10/2003 | Goldenberg | G05G 1/08 345/156 |
| 8,958,765 B2 | 2/2015 | Jarvinen et al. | |
| 10,762,752 B1 * | 9/2020 | Persson | G08B 6/00 |
| 2001/0053944 A1 | 12/2001 | Marks | |
| 2002/0171627 A1 * | 11/2002 | Noguchi | B60K 37/06 345/156 |
| 2004/0119683 A1 | 6/2004 | Warn | |
| 2004/0262410 A1 | 12/2004 | Hull | |
| 2005/0018172 A1 * | 1/2005 | Gelfond | G06F 3/0489 356/51 |
| 2005/0115816 A1 * | 6/2005 | Gelfond | G06F 3/0414 200/339 |
| 2005/0195156 A1 * | 9/2005 | Pihlaja | G06F 3/03547 345/156 |
| 2005/0224322 A1 * | 10/2005 | Kikuya | H01H 25/06 200/11 R |
| 2006/0012584 A1 * | 1/2006 | Vassallo | G06F 3/016 345/184 |
| 2006/0092130 A1 * | 5/2006 | Choquet | B60K 35/00 345/156 |
| 2006/0207867 A1 * | 9/2006 | Waddington | H03K 17/962 200/315 |
| 2007/0152988 A1 * | 7/2007 | Levin | G06F 3/016 345/184 |
| 2007/0237136 A1 | 10/2007 | Sako | |
| 2007/0266344 A1 | 11/2007 | Olcott | |
| 2008/0033256 A1 | 2/2008 | Farhan | |
| 2008/0055241 A1 * | 3/2008 | Goldenberg | G06F 3/016 345/156 |
| 2008/0129707 A1 * | 6/2008 | Pryor | G06F 3/0425 345/175 |
| 2008/0238879 A1 * | 10/2008 | Jaeger | G06F 3/03545 345/173 |
| 2009/0079698 A1 * | 3/2009 | Takashima | G06F 3/0362 345/169 |
| 2009/0079712 A1 * | 3/2009 | Levin | G05G 9/047 345/184 |
| 2010/0089564 A1 | 4/2010 | Nomura | |
| 2012/0001773 A1 | 1/2012 | Lyons | |
| 2012/0130547 A1 * | 5/2012 | Fadell | G05D 23/1917 700/276 |
| 2013/0099124 A1 * | 4/2013 | Filson | F24F 11/89 250/349 |
| 2013/0217351 A1 * | 8/2013 | Jarvinen | H04B 1/082 455/230 |
| 2013/0292481 A1 * | 11/2013 | Filson | G05D 23/1902 236/1 C |
| 2014/0139422 A1 | 5/2014 | Mistry | |
| 2014/0139541 A1 * | 5/2014 | Willaert | G09G 5/003 345/589 |
| 2015/0253942 A1 | 9/2015 | Kurokawa et al. | |
| 2015/0282257 A1 * | 10/2015 | Hoare | H05B 6/6438 219/719 |
| 2016/0196103 A1 * | 7/2016 | Tang | H03F 3/45 341/35 |
| 2016/0378131 A1 * | 12/2016 | Battlogg | F16H 59/0217 74/553 |
| 2016/0378322 A1 * | 12/2016 | Klicpera | G06F 3/0482 715/773 |
| 2017/0045958 A1 * | 2/2017 | Battlogg | G06F 3/0487 |
| 2017/0357317 A1 * | 12/2017 | Chaudhri | G06F 3/016 |
| 2018/0298959 A1 * | 10/2018 | Battlogg | F16C 33/6688 |
| 2018/0373350 A1 * | 12/2018 | Rao | G06F 3/038 |
| 2020/0073487 A1 * | 3/2020 | Ballan | G06F 3/0362 |
| 2020/0117288 A1 * | 4/2020 | Lopez | G06F 3/0393 |
| 2020/0150786 A1 * | 5/2020 | Chu | H03K 17/96 |

FOREIGN PATENT DOCUMENTS

| | | |
|---|---|---|
| CN | 104170263 A | 11/2014 |
| CN | 205265141 U | 5/2016 |
| CN | 207529869 U | 6/2018 |
| CN | 207727303 U | 8/2018 |
| CN | 207992863 U | 10/2018 |
| JP | 2012208821 A | 10/2012 |
| WO | WO-03017304 A2 * | 2/2003 ............... G05G 1/10 |
| WO | 2017/087872 A1 | 5/2017 |

OTHER PUBLICATIONS

(56) References Cited

OTHER PUBLICATIONS

Hong Kong Office Action dated Jan. 8, 2019 from corresponding HK Patent Application No. 16114084.0, 7 pages.

* cited by examiner

CONTROL KNOB FOR CONTROLLING OPERATION OF A MACHINE

CROSS REFERENCE TO RELATED APPLICATIONS

This application claims the benefit under 35 U.S.C. § 119(a) of Hong Kong Application No. 16114084.0 filed Dec. 9, 2016 and under 35 U.S.C. § 120 of U.S. application Ser. No. 15/808,072 filed on Nov. 9, 2017 the entire contents of both are hereby incorporated by reference herein in their entirety.

BACKGROUND OF THE DISCLOSURE

1. Field of the Disclosure

The present invention relates to the field of control knobs and control buttons for controlling operation of machines.

2. Description of the Related Art

Control panels of machines such as electrical home appliances (e.g. microwave ovens, washings machines, dryers) and motor vehicles typically include multiple control knobs (control buttons and the like) to control various operational modes of such machines. A transducer will typically sense the different rotational positions of a control knob and then output electrical control signals that are indicative of the sensed rotational positions (and hence the desired operational modes of the machine as selected by the user). For instance, multiple control knobs may be disposed on a control panel of a microwave oven to control such operational modes as the heating time, heating temperature, and defrosting time. Alternately, a control panel in a motor vehicle may for instance comprise multiple control knobs for operating the air-conditioning, the radio, and the sunroof. Furthermore, an electronic display may typically be disposed on the control panel next to the control knobs to visually display the selected operational modes of the machine that have been selected by the user. However, as the space that is available on the control panels of such machines is finite (and even more so in the context of machines with compact design aesthetics), there is a perceived need for control knobs which improve efficiency in the utilisation of control panel space on such machines without unduly compromising ease and speed of operation.

SUMMARY

The present invention seeks to alleviate at least one of the above-described problems.

The present invention may involve several broad forms. Embodiments of the present invention may include one or any combination of the different broad forms herein described.

In a first broad form, the present invention provides a control knob for controlling operation of a machine, the control knob including: an attachment member configured for attaching the control knob to a surface of the machine so that the control knob is operably connectable with the machine to control operation thereof; a display member comprising an electronic display module disposed thereon; an operational mode display controller for controlling display of operational modes of the machine upon the electronic display module, said operational mode display controller being configured for rotational movement around the electronic display module amongst a plurality of rotational positions, said operational mode display controller being operably connected with the electronic display module such that, responsive to the rotational movement of the operational mode display controller amongst the plurality of rotational positions, the electronic display module is configured to display a plurality of operational modes of the machine corresponding to the plurality of rotational positions; and an operational mode selector for controlling selection of one of the plurality of operational modes of the machine when said one of the plurality of operational modes is displayed on the electronic display module, the operational mode selector being configured for movement between at least a first position and a second position to actuate selection of the operational mode displayed on the electronic display module.

Preferably, the operational mode selector may comprise at least one of the (i) display member, and (ii) the operational mode display controller.

Preferably, the operational mode selector may be configured for depressible movement from at least an undepressed position into a depressed position, said depressible movement being configured to actuate selection of the operational mode displayed on the electronic display module, and whereby the operational mode selector is biased into the undepressed position by a biasing mechanism such that upon movement of the operational mode selector from the undepressed position into the depressed position the operational mode selector is thereafter urged back into the undepressed position by the biasing mechanism.

Preferably, the operational mode selector may be configured for depressible movement from at least the undepressed position into the depressed position along a movement axis extending in a substantially perpendicular direction relative to the electronic display module.

Alternately, the operational mode selector may be configured for at least one of tilting movement, pivoting movement, and sliding movement between at least the first position and the second position to actuate selection of the operational mode displayed on the electronic display module.

Preferably, the display member may include an end surface upon which the electronic display module is disposed thereon and a sidewall extending substantially perpendicularly from an edge-region of the end surface.

Preferably, the display member may include a cylindrical-shaped configuration.

Preferably, the operational mode display controller may include an annular member having a passage extending along an elongate axis thereof, said annular member being configured for surrounding the display member whereby the passage of the annular member is shaped for the display member to extend therethrough.

Preferably, the annular member may include a cylindrical-shaped sleeve having a sidewall extending in a substantially parallel orientation to the sidewall of the display member.

Typically, the present invention may include a mechanism configured for vibrating the control knob in response to the operational mode selector being moved to actuate selection of an operational mode of the machine.

Typically, the electronic display module may be configured to output at least one of a predefined colour or brightness in response to the operational mode selector being moved to actuate selection of an operational mode of the machine.

Typically, the control knob may include a sound emitter configured to output a predefined sound in response to the operational mode selector being moved to actuate selection of an operational mode of the machine.

Typically, the electronic display module may include a touchscreen display and whereby the touchscreen display is operable by a user to perform at least one of:

(a) displaying the plurality of operational modes of the machine; and (b) selecting one of the plurality of operational modes when said one of the plurality of operational modes is displayed on the electronic display module.

Typically, the present invention may include a wireless communication module configured for communication with a wireless communication module of an external device, said external device including at least one of (i) the machine (ii) a smartphone device, and (iii) a personal computer.

Typically, the wireless communication module may include at least one of a Wi-Fi and a Bluetooth type wireless communication module.

Preferably, the operational mode selector may include a gripping surface disposed on the sidewall.

In a second broad form, the present invention provides a control button for controlling operation of a machine, the control button including: an attachment member configured for attaching the control button to a surface of the machine so that the control button is operably connectable with the machine to control operation thereof; a display member comprising an electronic display module disposed thereon; an operational mode display controller for controlling display of operational modes of the machine upon the electronic display module, said operational mode display controller being operably connected with the electronic display module such that, responsive to operation of the operational mode display controller, the electronic display module is configured to display a plurality of operational modes of the machine; and an operational mode selector for controlling selection of one of the plurality of operational modes of the machine when said one of the plurality of operational modes is displayed on the electronic display module, the operational mode selector being configured for movement between at least a first position and a second position to actuate selection of the operational mode displayed on the electronic display module.

Preferably, the operational mode selector may comprise the display member.

Preferably, the operational mode selector may be configured for depressible movement from at least an undepressed position into a depressed position, said depressible movement being configured to actuate selection of the operational mode displayed on the electronic display module, and whereby the operational mode selector is biased into the undepressed position by a biasing mechanism such that upon movement of the operational mode selector from the undepressed position into the depressed position the operational mode selector is thereafter urged back into the undepressed position by the biasing mechanism.

Preferably, the operational mode selector may be configured for depressible movement from at least the undepressed position into the depressed position along a movement axis extending in a substantially perpendicular direction relative to the electronic display module.

Alternately, the operational mode selector may be configured for at least one of tilting movement, pivoting movement, and sliding movement between at least the first position and the second position to actuate selection of the operational mode displayed on the electronic display module.

Preferably, the display member may include an end surface upon which the electronic display module is disposed thereon and a sidewall extending substantially perpendicularly from an edge-region of the end surface.

Preferably, the display member may include a square or rectangular-shaped configuration.

Preferably, the operational mode display controller may include a touchpad device.

Typically, the present invention may include a mechanism configured for vibrating the control knob in response to the operational mode selector being moved to actuate selection of an operational mode of the machine.

Typically, the electronic display module may be configured to output at least one of a predefined colour or brightness in response to the operational mode selector being moved to actuate selection of an operational mode of the machine.

Typically, the control knob may include a sound emitter configured to output a predefined sound in response to the operational mode selector being moved to actuate selection of an operational mode of the machine.

Typically, the electronic display module may include a touchscreen display and whereby the touchscreen display may be operable by a user to perform at least one of:

(a) displaying the plurality of operational modes of the machine; and (b) selecting one of the plurality of operational modes when said one of the plurality of operational modes is displayed on the electronic display module.

Typically, the present invention may include a wireless communication module configured for communication with a wireless communication module of an external device, said external device including at least one of (i) the machine (ii) a smartphone device, and (iii) a personal computer.

Typically, the wireless communication module may include at least one of a Wi-Fi and a Bluetooth type wireless communication module.

Preferably, the operational mode selector may include a gripping surface disposed on the sidewall.

In a third broad form, the present invention provides a control knob for controlling operation of a machine, the control knob including: an attachment member configured for attaching the control knob to a surface of the machine so that the control knob is operably connectable with the machine to control operation thereof; a display member comprising an electronic display module disposed thereon, said display member being configured for rotational movement about a movement axis extending substantially perpendicularly to a planar face of the display member, said electronic display module being configured such that, responsive to the rotational movement of the display member, the electronic display module displays a plurality of operational modes of the machine corresponding to the plurality of rotational positions; and an operational mode selector for controlling selection of one of the plurality of operational modes of the machine when said one of the plurality of operational modes is displayed on the electronic display module, the operational mode selector being configured for movement between at least a first position and a second position to actuate selection of the operational mode displayed on the electronic display module.

Preferably, the operational mode selector comprises the display member.

Preferably, the operational mode selector may be configured for depressible movement from at least an undepressed position into a depressed position, said depressible movement being configured to actuate selection of the operational mode displayed on the electronic display module, and whereby the operational mode selector is biased into the undepressed position by a biasing mechanism such that upon movement of the operational mode selector from the undepressed position into the depressed position the operational mode selector is thereafter urged back into the undepressed position by the biasing mechanism.

Preferably, the operational mode selector may be configured for depressible movement from at least the undepressed position into the depressed position along a movement axis extending in a substantially perpendicular direction relative to the electronic display module.

Alternately, the operational mode selector may be configured for at least one of tilting movement, pivoting movement, and sliding movement between at least the first position and the second position to actuate selection of the operational mode displayed on the electronic display module.

Preferably, the display member may include an end surface upon which the electronic display module is disposed thereon and a sidewall extending substantially perpendicularly from an edge-region of the end surface.

Preferably, the display member may include a cylindrical-shaped configuration.

Typically, the present invention may include a mechanism configured for vibrating the control knob in response to the operational mode selector being moved to actuate selection of an operational mode of the machine.

Typically, the electronic display module may be configured to output at least one of a predefined colour or brightness in response to the operational mode selector being moved to actuate selection of an operational mode of the machine.

Typically, the control knob may include a sound emitter configured to output a predefined sound in response to the operational mode selector being moved to actuate selection of an operational mode of the machine.

Typically, the electronic display module may include a touchscreen display and whereby the touchscreen display may be operable by a user to perform at least one of:

(a) displaying the plurality of operational modes of the machine; and (b) selecting one of the plurality of operational modes when said one of the plurality of operational modes is displayed on the electronic display module.

Typically, the present invention may include a wireless communication module configured for communication with a wireless communication module of an external device, said external device including at least one of (i) the machine (ii) a smartphone device, and (iii) a personal computer.

Typically, the wireless communication module may include at least one of a Wi-Fi and a Bluetooth type wireless communication module.

Preferably, the present invention may include a gripping surface disposed on the sidewall of the display member.

Preferably, the electronic display module may be configured to display indicia representing operational modes of the machine in a uniform orientation relative to the surface of the machine so as to be readable by a user irrespective of a rotational position of the display member.

In a further broad form, the present invention provides a machine including a control knob or control button in accordance with any one of broad forms of the present invention described herein.

BRIEF DESCRIPTION OF THE DRAWINGS

The present invention will become more fully understood from the following detailed description of a preferred but non-limiting embodiments thereof, described in connection with the accompanying drawings, wherein.

DETAILED DESCRIPTION OF THE PREFERRED EMBODIMENTS

Figure 1A:
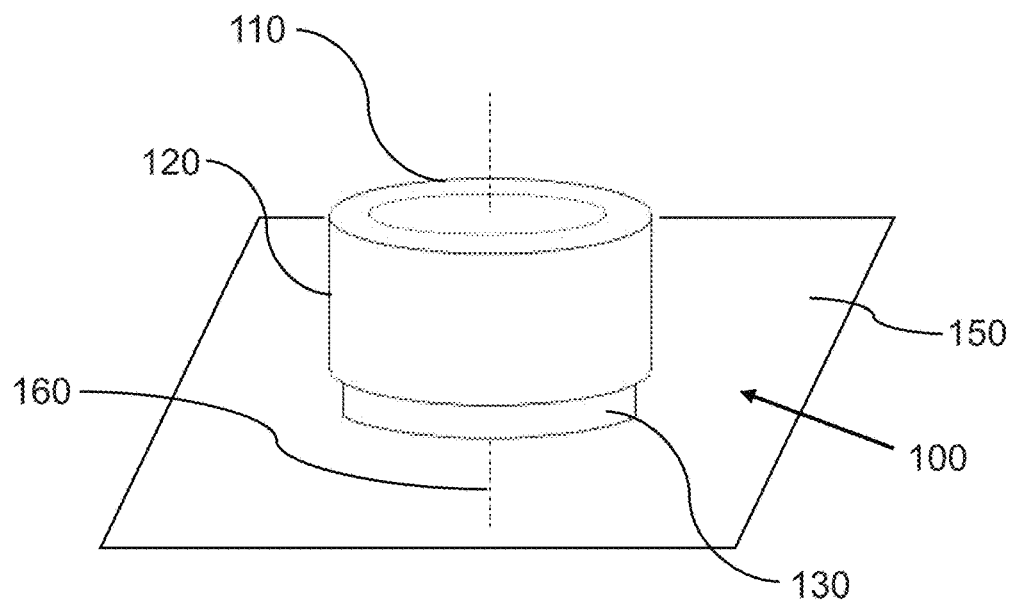
FIGS. 1A-1C depicts a perspective view of a control knob attached to a surface of a machine in sequence of operation in accordance with a first embodiment of the present invention.

Preferred embodiments of the present invention will now be described herein with reference to FIGS. 1 to 5 in the form of a control knob and control button that may, for instance, be mounted on the console of a motor vehicle and configured to control a range of vehicle systems including audio output functions from speakers, environmental functions such as air conditioning and heating, mechanical functions including for adjusting and moving mirrors, seats, sunroof, etc., and other system functions such as a security or alarm of the motor vehicle. Alternately, the control knob and control button may be mounted on the control panel of a microwave oven, washing machine or other electrical home appliance, and configured for controlling operational modes of such machines.

Referring firstly to FIGS. 1A to 1E, a first embodiment control knob (100) is shown which includes an attachment member (130) configured for attaching the control knob (100) to a control panel surface (150) of a machine (440). The attachment member (130) may for instance comprise a metal base plate having apertures disposed therein so that screws or other fastening members (130A) may pass through to effect securement of the control knob (100) to the control panel surface (150).

The control knob (100) also includes a display member (110) that is movably coupled to the attachment member (130). The display member (110) includes a cylindrical-shaped configuration having a planar end surface and an annular sidewall extending in a substantially perpendicular direction from an edge of the planar end surface towards the attachment member (130). The display member (110) may comprise any suitably rigid material such as a metal material or a rigid plastic material.

The display member (110) and the attachment member (130) form a housing therebetween within which mechanical and electronic components of the control knob (100) may be housed.

An electronic display module (140) is mounted on top of the planar end surface of the display member (110) by any suitable mounting mechanism, or, may be recessed into the planar end surface so that it lies flush with the planar end surface. The electronic display module (140) may typically comprise a liquid crystal display (LCD), a thin film transistor liquid crystal display (TFT LCD), an organic light-emitting diode (OLED) display, an active matrix OLED (AMOLED) display, a backlit display, or any other suitable electronic display technology. In some embodiments, the electronic display module (140) can include a touch-sensitive technology to allow a user to "touch" displayed indicia or icons directly on the electronic display surface to navigate through possible operational mode options and/or to actuate selection of any one of the displayed operational modes. The electronic display module (140) is powered by the power supply of the machine via suitable electronic power interfacing circuitry although in alternate embodiments it may be powered by a stand-alone battery unit that may be located within the housing.

The control knob (100) further comprises an operational mode display controller (120) which may be gripped and manipulated by the user's hand in order to control the display of operational modes of the machine upon the electronic display module (140). The operational mode display controller (120) comprises a cylindrical-shaped sleeve having an annular sidewall and a passage extending along an elongate axis thereof. The cylindrical-shaped sleeve (120) is configured for attachment with the display member (110) so as to surround the display member (110) and to be rotatably movable coaxially about the display member (110) amongst a plurality of rotational positions. The passage of the cylindrically-shaped sleeve (120) is shaped to allow the display member (110) to extend through the passage and the sidewall of the cylindrical-shaped sleeve extends in a substantially parallel orientation relative to the sidewall of the display member (110). A detent mechanism may be disposed between the cylindrically-shaped sleeve (120) and the display member (110) to allow controlled incremental rotational movement of the operational mode display controller (120) about the display member (110) into its plurality of rotational positions. The step of rotating the operational mode display controller to navigate through a series of potentially selectable operational modes of the machine (440) is represented by block (500) in the flowchart of FIG. 5.

Rotational movement of the operational mode display controller (120) is sensed by a first sensor module (410) which may comprise a rotary-actuated potentiometer, an optical sensor or any other sensor device suitable for this application. For instance, the operational mode display controller could be coupled to a transducer shaft that turns with rotation of the operational mode display controller (120) and the movement of the transducer shaft could be used to actuate sensor readings by the sensor module (410). The first sensor module (410) is operably connected with a microcontroller module (430) and communicates signals to the microcontroller module (430) that are indicative of the various rotational positions of the operational mode display controller (120). The microcontroller module (430) receives the signals from the first sensor module (410) via a sensor interface and is programmed to associate the rotational position of the operational mode display controller (120) indicated by the sensor signals with actual operational modes of the machine by reference to a predetermined lookup table programmed in to the microcontroller module (430). The microcontroller module (430) is operably connected to the electronic display module (140) and transmits control signals to the electronic display module (140) to display information indicative of operational modes of the machine corresponding to the sensed rotational position of the operational mode display controller (120). The operational modes of the machine (440) may include for instance, where the machine is a washer/dryer machine, the options of either hot and cold water washing operational modes, the options of various wash times, and, the option of various dryer times. Each such option may broadly be considered as an operational mode of the machine that may be selected by the user. The step of the electronic display module (140) displaying potentially selectable operational modes of the machine corresponding to rotational positions of the operational mode display controller (120) about the display member (110) is represented by block (510) in the flowchart of FIG. 5.

Figure 1B:
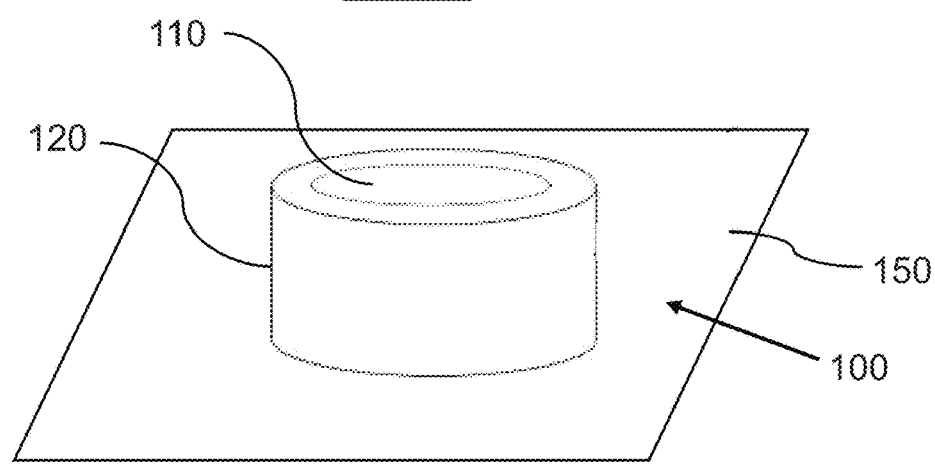
Figure 1C:
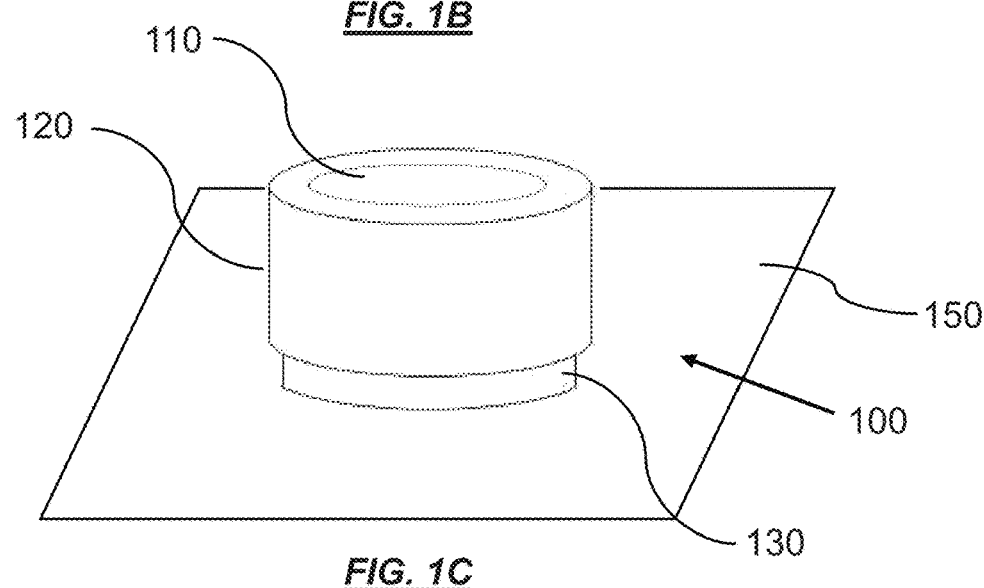
Figure 1D:
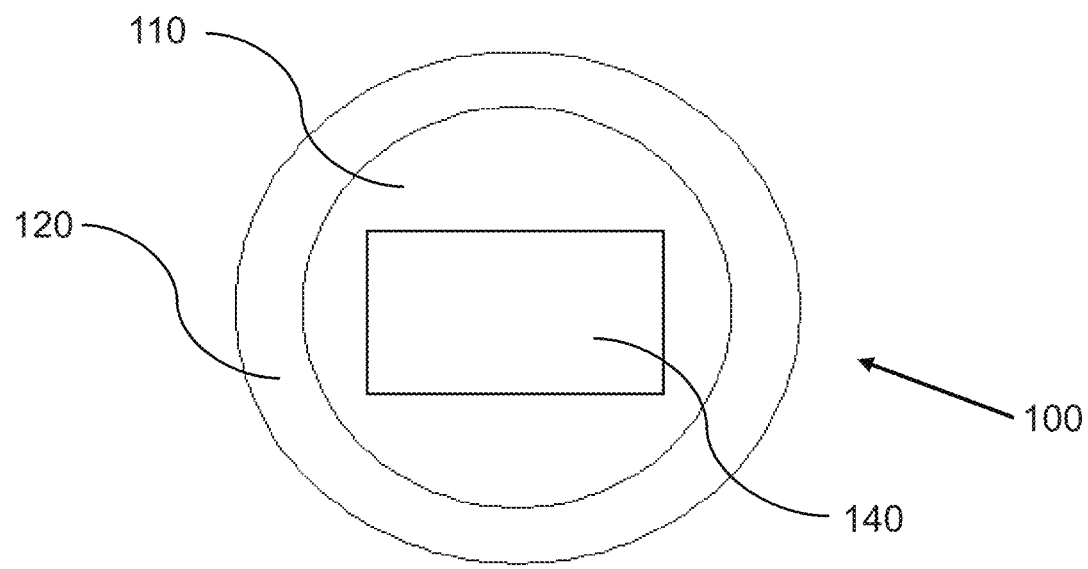
FIG. 1D depicts a top view of the control knob in accordance with the first embodiment of the present invention.
Figure 1E:
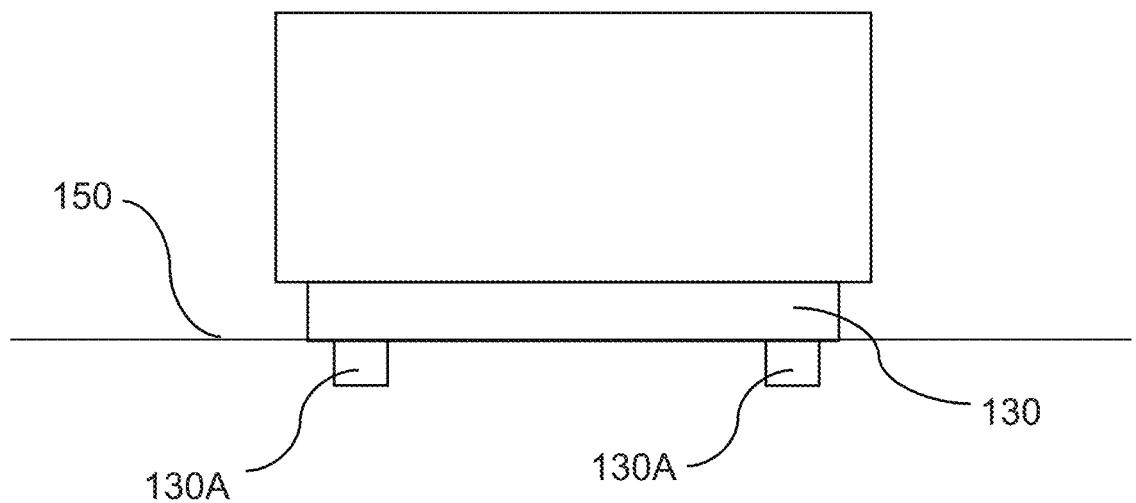
FIG. 1E depicts a side view of the control knob arranged in an undepressed position in accordance with the first embodiment of the present invention.

The control knob (100) includes an integrally formed operational mode selector (110,120) which is configured for actuating the selection of one of the plurality of operational modes of the machine that is displayed on the electronic display module (140). The operational mode selector (110, 120) is configured for movement between at least a first position and a second position to actuate selection of the operational mode displayed on the electronic display module (140) at any given time. In this embodiment, the operational mode selector (110,120) is comprised by both the display member (110) and operational mode display controller (120) which are movable together as a single actuating mechanism by the user to actuate selection of the operational mode displayed on the electronic display module (140). More particularly, in this embodiment, the operational mode selector (110,120) is configured for depressible movement from at least an undepressed position (as shown in FIG. 1A) into a depressed position (as shown in FIG. 1B) so as to actuate selection of the operational mode displayed on the electronic display module (140). The operational mode selector (110, 120) is configured for depressible movement from at least the undepressed position into the depressed position along a movement axis (160) extending in a substantially perpendicular direction relative to the electronic display module (140). The operational mode selector (110,120) is biased into the undepressed position by a return spring disposed between the display member (110) and the attachment member (130) such that upon movement of the operational mode selector (110,120) from the undepressed position into the depressed position the operational mode selector is thereafter urged back into the undepressed position by the biasing mechanism (as depicted in FIG. 1C). In alternate embodiments of the present invention, the operational mode selector (110,120) may be configured to move in other ways apart from depressible movement. For instance, the operational mode selector (110,120) could be configured for tilting movement, pivoting movement, or sliding movement between at least the first position and the second position to actuate selection of the operational mode displayed on the electronic display module (140). In yet alternate embodiments, it is possible that the operational mode selector may comprise the operational mode display controller alone or the display member alone. The step of the operational mode selector (110,120) actuating selection of an operational mode displayed on the electronic display module (140) is represented by block (520) in the flowchart of FIG. 5.

Movement of the operational mode selector (110,120) is sensed by a second sensor module (410) which may also comprise a potentiometer, and optical sensor or any other sensor device suitable for this application. The sensor module (410) is operably connected with the microcontroller module (430) and communicates signals to the microcontroller module (430) indicative of the operational mode selector (110,120) being depressed by the user. The microcontroller module (430) receives the signal from the sensor module (410) and is programmed to recognise this as being indicative of the selection of a particular operational mode being displayed on the electronic display module (140). Thereafter, the microcontroller module (430) communicates the selected operational mode externally of the control button (100) to a control module of the machine (440) either via electrical bus wiring, or, wirelessly via a wireless communication module. The step of the microcontroller module (430) sending a control signal to the machine (440) indicative of the selected operational mode is represented by block (530) in the flowchart of FIG. 5.

Figure 3:
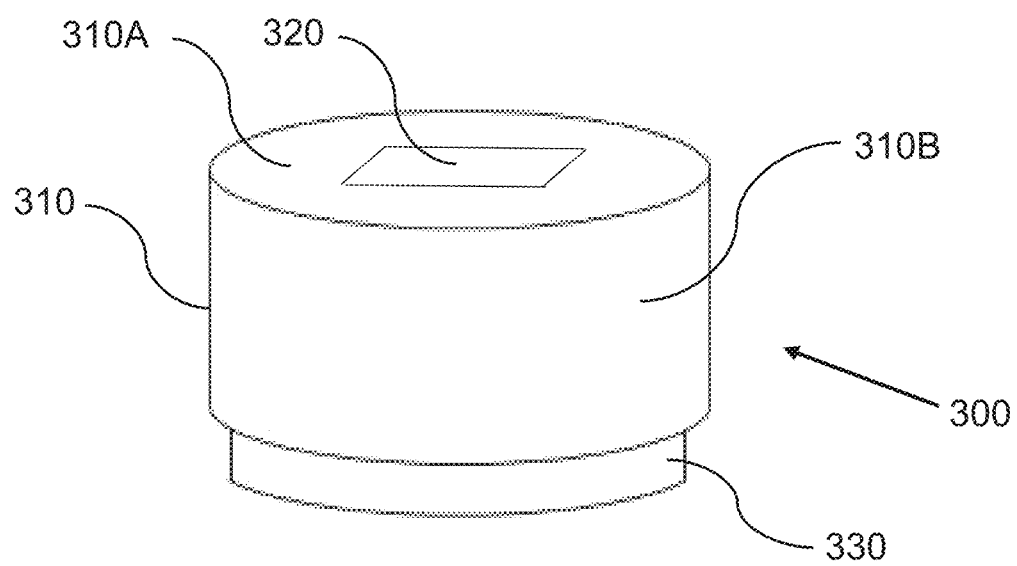
FIG. 3 depicts a perspective view of a control knob arranged in an undepressed position in accordance with a third embodiment of the present invention.
Figure 4:
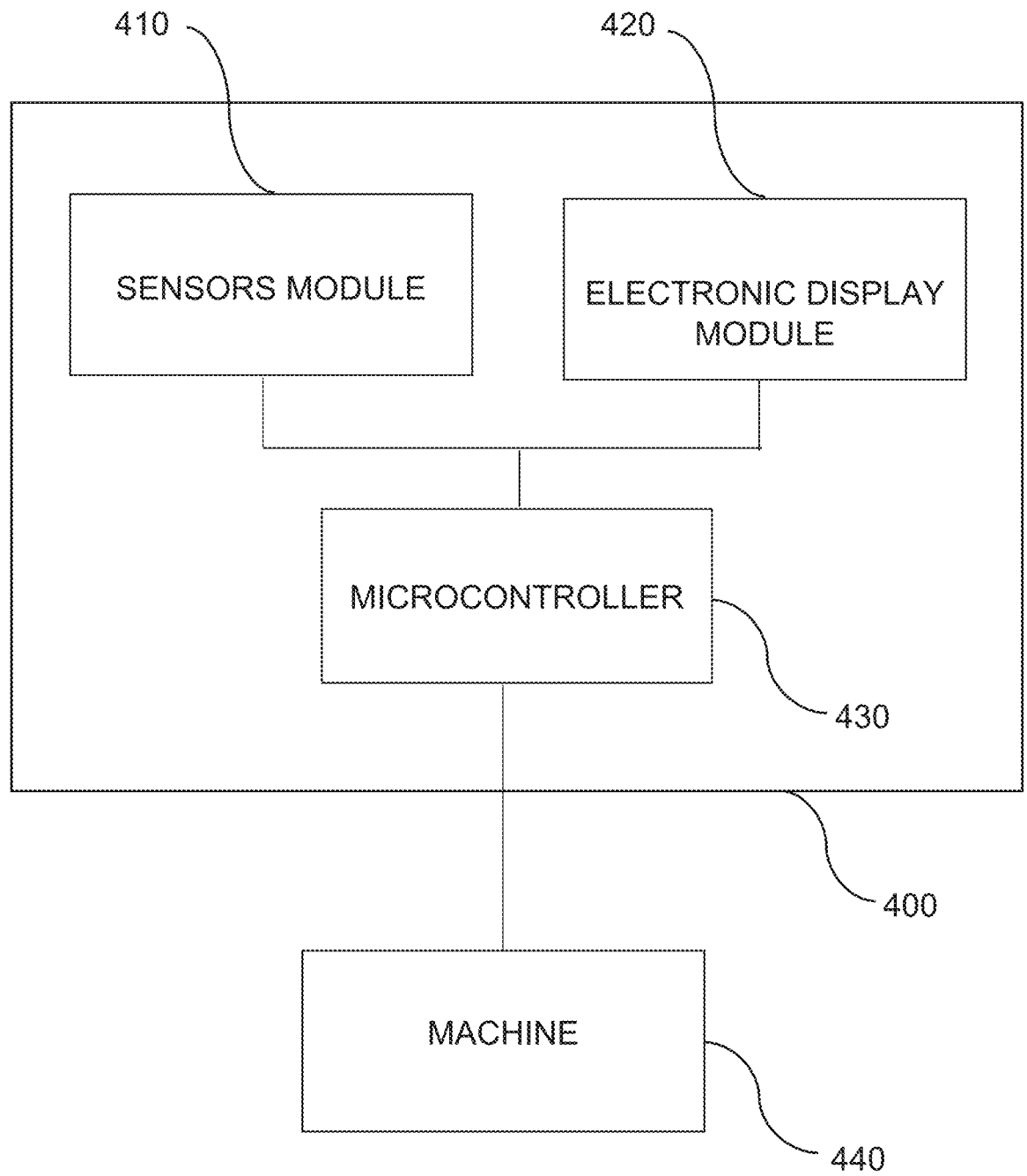
FIG. 4 depicts a functional block diagram of a control knob/button operably connected with an electrical applicant in accordance with one embodiment of the present invention.
Figure 5:
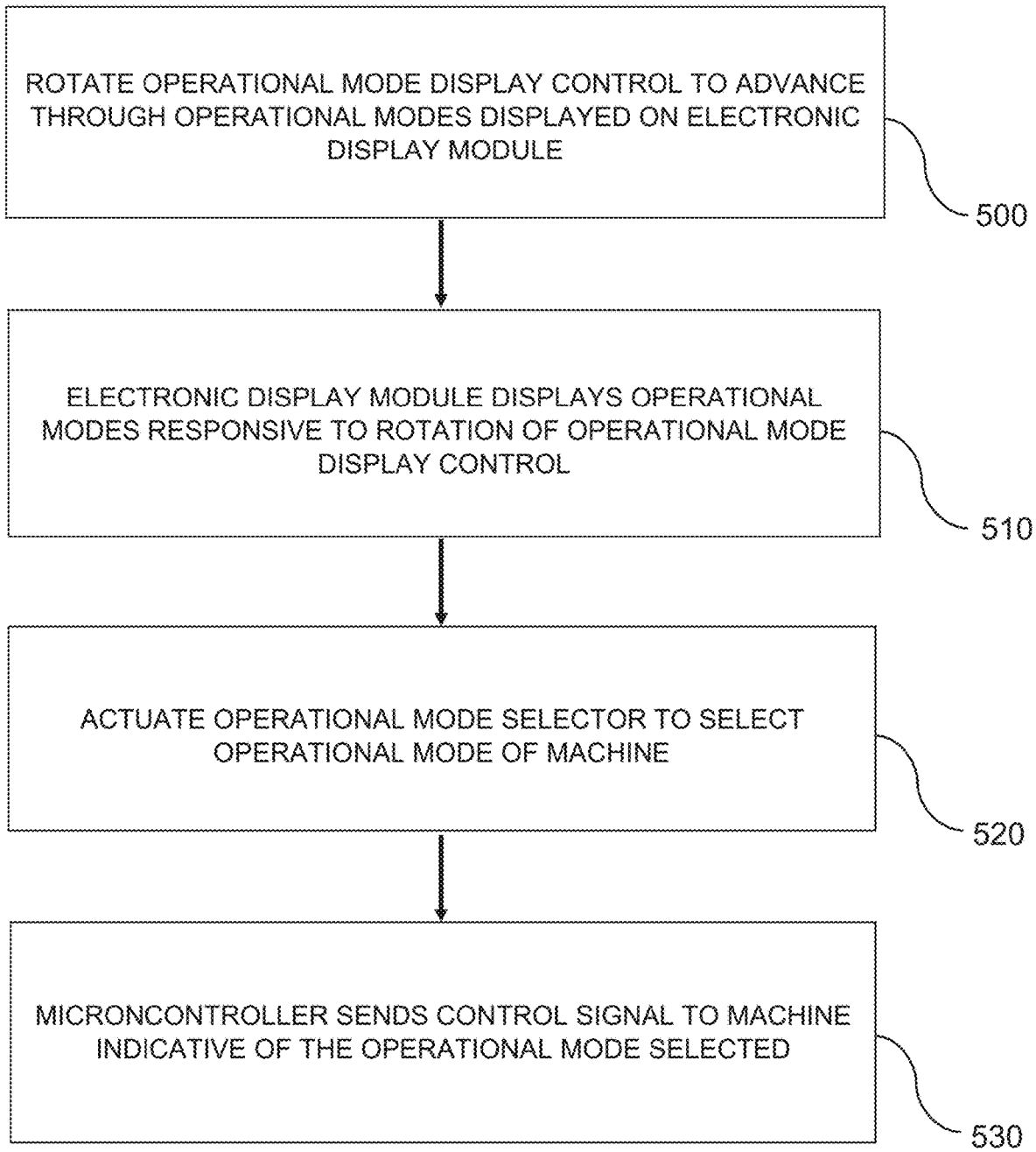
FIG. 5 depicts a flowchart of process steps for using a control knob/button in accordance with one embodiment of the present invention.

Referring to FIG. 3, an alternate embodiment (300) of the control knob is shown whereby it differs from the preceding embodiment by virtue of the absence of the annular sleeve surrounding the display member. Instead, in this alternate embodiment, the display member (310) functions as both the operational mode display controller and the operational mode selector. The display member (310) of this embodiment is configured to rotate about a movement axis extending substantially perpendicularly to a planar end surface (310A) of the display member (310). In response to rotational movement of the display member (310) around the movement axis, an electronic display module (320) disposed on the planar end surface (310A) displays a plurality of operational modes of the machine (440) corresponding to the plurality of rotational positions. Because the electronic display module (320) will rotate with rotational movement of the display member (310), in order for the information displayed on the electronic display module (320) to be easily readable at all times during rotation, the electronic display module (320) is configured to sense the rotational positions of the electronic display module (320) relative to the control panel surface of the machine (440) to which it is mounted and to display text or images representing the operational modes of the machine (440) or other information in a uniform orientation relative to the surface of the machine (440) at all times so as to be readable by a user irrespective of a rotational position of the display member (310).

Referring now to FIGS. 2A to 2D, a further embodiment of the present invention is shown comprising a control button (200) for mounting on a control panel surface of a machine (440) to control operational modes of the machine (440). In this embodiment, the control button (200) is also integrally formed with an attachment member (230) similarly as described in relation to the above embodiments, configured for attaching the control button (200) to the control panel surface of a machine (440).

The control button (200) includes a display member (210) that is movably coupled to the attachment member (230). The display member (210) includes a rectangular-shaped configuration having a planar end surface (210A) and a sidewall (210B) extending in a substantially perpendicular direction from edges of the planar end surface (210A) towards the attachment member (230), as shown in the drawings. The display member (210) may comprise any suitably rigid material such as a metal material or a rigid plastic material. The display member (210) and the attachment member (230) form a housing therebetween within which mechanical components (e.g. biasing device) and electronic components (e.g. microcontroller module, sensor circuitry, PCBs, bus wires, power modules etc.) the control knob may be housed.

An electronic display module (220) is mounted on top of the planar end surface (210A) of the display member (210) by any suitable mounting mechanism, or, may be recessed into the planar end surface (210A) so that it lies flush with the planar end surface (210A). The electronic display module (220) may typically comprise a liquid crystal display (LCD), a thin film transistor liquid crystal display (TFT LCD), an organic light-emitting diode (OLED) display, an active matrix OLED (AMOLED) display, or any other suitable electronic display technology. In some embodiments, the electronic display module (220) can include a touch-sensitive technology to allow a user to "touch" displayed indicia or icons directly on the electronic display surface to navigate through possible operational mode options and/or to actuate selection of any one of the displayed operational modes. The electronic display module (220) is powered by the power supply of the machine via suitable electronic power interfacing circuitry although in alternate embodiments it may be powered by a stand-alone battery unit that may be located within the housing.

The control button (200) further comprises an operational mode display controller (240) in the form of a touchpad (240) input device for controlling the display of operational modes of the machine (440) upon the electronic display module (220). The touchpad (240) is disposed on the display member (210A) adjacent to the electronic display module (220) and is operably connected to the electronic display module (220) via a microcontroller module (430) such that in response to touch inputs entered by the user via the touchpad (240), the microcontroller module (430) is programmed to signal the electronic display module (220) to display predetermined operational modes of the machine (440) corresponding to the touch inputs.

Figure 2A:
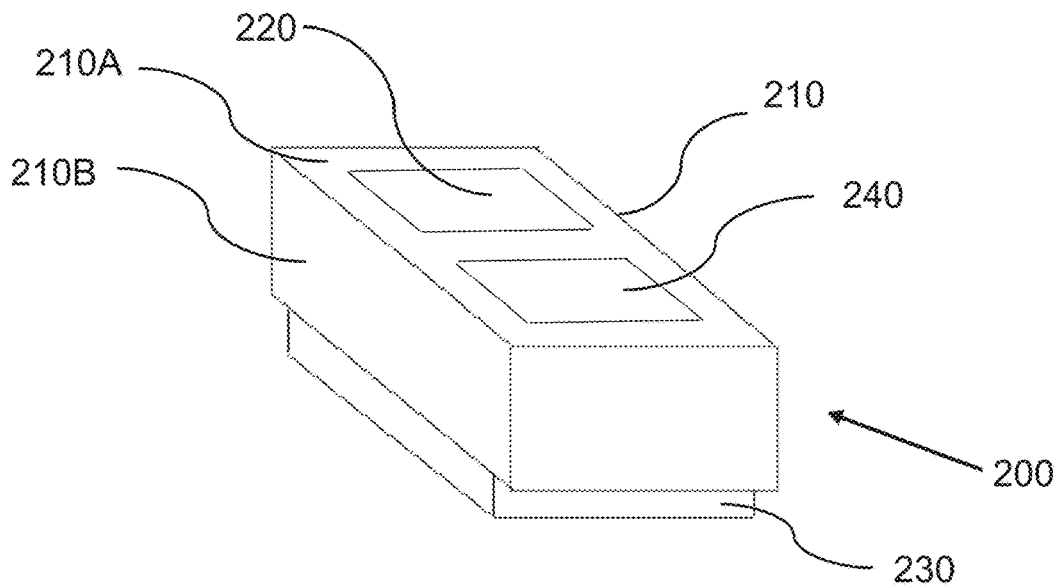
FIGS. 2A-2C depicts a perspective view of a control button attached to a surface of a machine in sequence of operation in accordance with a second embodiment of the present invention.
Figure 2B:
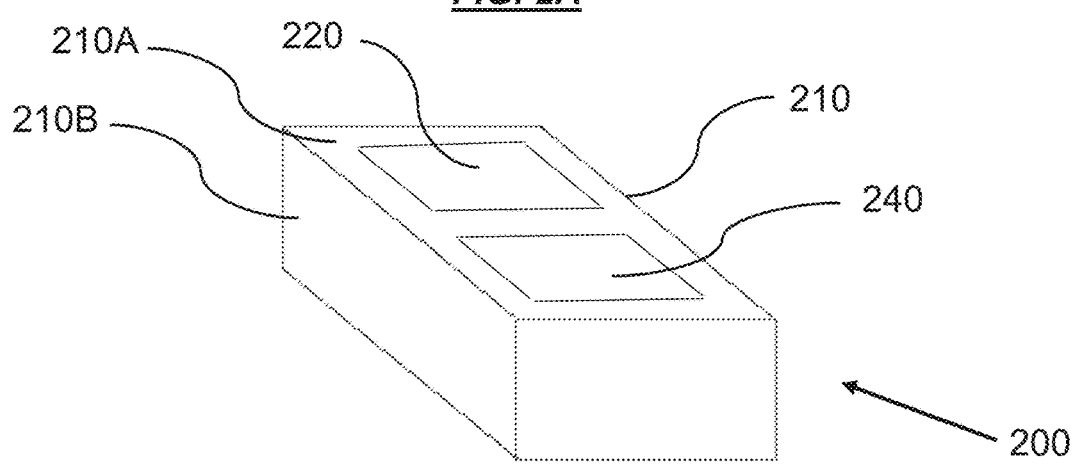
Figure 2C:
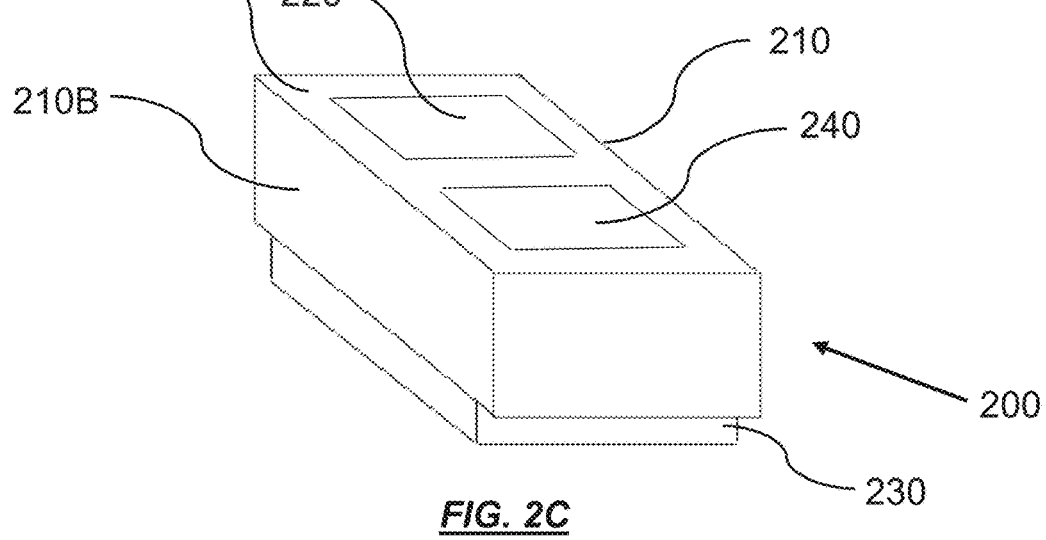
Figure 2D:
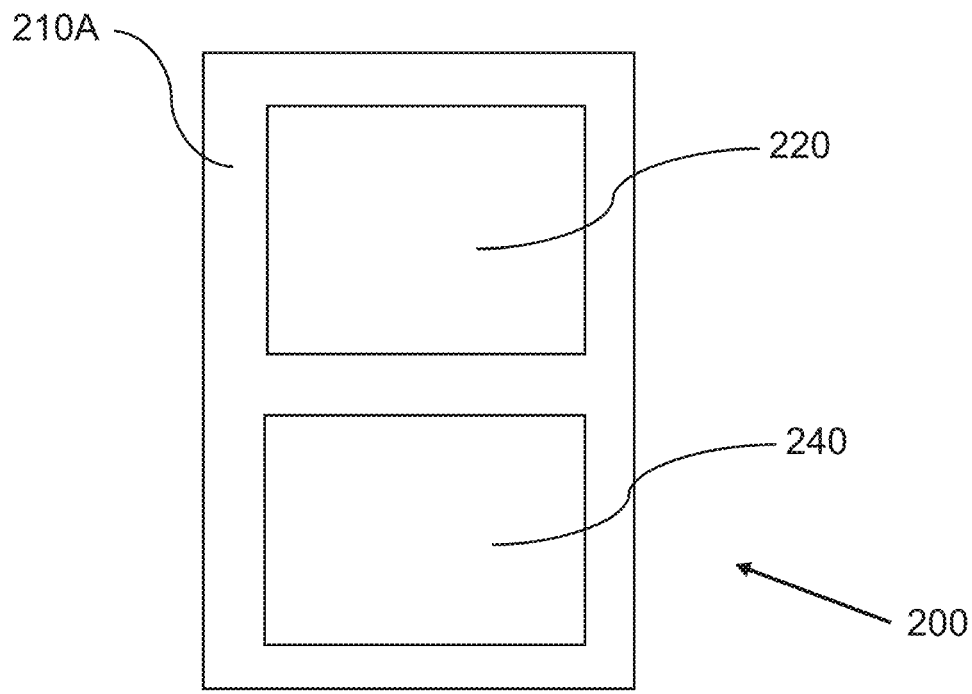
FIG. 2D depicts a top view of the control button in accordance with the second embodiment of the present invention.

An operational mode selector is integrally formed in the control button which is configured for controlling selection of one of the plurality of operational modes of the machine (440) that is displayed on the electronic display module (220) at any given time. The operational mode selector is configured for movement between at least a first position and a second position to actuate selection of the operational mode displayed on the electronic display module at any given time. In this embodiment, the operational mode selector function is performed also by the display member (210) which is movable as a single actuating mechanism by the user to actuate selection of the operational mode displayed on the electronic display module (220). More particularly, in this embodiment, the operational mode selector 210) is configured for depressible movement from at least an undepressed position (as shown in FIG. 2A) into a depressed position (as shown in FIG. 2B) so as to actuate selection of the operational mode displayed on the electronic display module (220). The operational mode selector (210) is configured for depressible movement from at least the undepressed position into the depressed position along a movement axis extending in a substantially perpendicular direction relative to the electronic display module (220). The operational mode selector (210) is biased into the undepressed position by a return spring disposed between the display member (210) and the attachment member (230) such that upon movement of the operational mode selector (210) from the undepressed position into the depressed position the operational mode selector is thereafter urged back into the undepressed position by the biasing mechanism (as depicted in FIG. 2C). In alternate embodiments of the present invention, the operational mode selector (210) may be configured to move in other ways apart from depressible movement. For instance, the operational mode selector (210) could be configured for tilting movement, pivoting movement, or sliding movement between at least the first position and the second position to actuate selection of the operational mode displayed on the electronic display module (220).

Movement of the operational mode selector (210) is sensed by a sensor module (410) which may comprise a rotary-actuated potentiometer, an optical sensor or any other sensor device suitable for this application. The sensor module (410) is operably connected with the microcontroller module (430) and communicates signals to the microcontroller module (430) indicative of the operational mode selector (210) being depressed by the user. The microcontroller module (430) receives the signal from the sensor module (410) and is programmed to recognize this as being indicative of the selection of a particular operational mode being displayed on the electronic display module (220). Thereafter, the microcontroller module (430) communicates the selected operational mode externally of the control button (200) to a control module of the machine (440) either via electrical bus wiring, or, wirelessly via a wireless communication module.

In the various embodiments described herein, the operational mode display controller and/or the operational mode selector may be further programmed for manipulation by the user to navigate through a plurality of different operational mode menus or listings. Accordingly, multi-level menus and listings of operational mode options may be displayable and selectable via a single control knob. For instance, a user may toggle between a first menu of operational mode options relating to wash cycle duration, a second menu of operational mode options relating to wash temperature modes, and a third menu of operational mode options relating to dryer time options displayable on the electronic display module. The operational mode display controller and operational mode selector may further be configured to allow the user to display and select other information such as displaying the current operational mode settings of the machine, displaying a history log of previous operational mode selections made in respect of the machine, or, suggested default operating modes may be pre-emptively displayed to the user for possible selection. The operational mode display controller and the operational mode selector may be yet further configured to allow the user to control values or magnitudes of different operational modes that are selected. By way of example, the operational mode display controller and/or the operational mode selector may be configured for manipulation by the user to incrementally increase or decrease the temperature value of a washing machine that the user has already selected to function in accordance with a hot water wash cycle, or, to incrementally increase of decrease the wash cycle time of the washing machine.

In the various embodiments described above, the electronic display module may further include a touchscreen display which may additionally be operable by a user to display the plurality of operational modes of the machine thereon, and/or, to select one of the plurality of operational modes displayed on the electronic display module.

Conveniently, as the electronic display module, the operational mode display controller and the operational mode selector are integrally formed in a single control knob/button, this provides a relatively compact configuration that lends itself well towards more efficient utilisation of control panel space on a machine without compromising ease and speed of operability by the user. The sidewall of the control knob/button display member or annular sleeve may also include a textured surface in the form of ridges, lines, bumps, or other projections extending therefrom to allow gripping by a user's hand and to provide the user with further enhanced tactile feel and control of the control knob in use. This provides a notable improvement over certain existing technologies where actuation thereof to select an operational mode does not allow for the entire control knob/button to be gripped and moved but instead may require the user to move only a portion of the control knob or button to actuate the selection. Furthermore, the control knob may further include a mechanism configured for outputting a tactile, aural and/or visual alert to the user confirming that selection of an operational mode has been actuated by operation of the operational mode selector. For instance, the microcontroller unit of the control knob may be configured to signal the alert mechanism to emit a sound (via a sound emitter), emit a colour lighting or brightness characteristic via the electronic display module, or vibrate.

Those skilled in the art will appreciate that the invention described herein is susceptible to variations and modifications other than those specifically described without departing from the scope of the invention. All such variations and modification which become apparent to persons skilled in the art, should be considered to fall within the spirit and scope of the invention as broadly hereinbefore described. It is to be understood that the invention includes all such variations and modifications. The invention also includes all of the steps and features, referred or indicated in the specification, individually or collectively, and any and all combinations of any two or more of said steps or features.

The reference to any prior art in this specification is not, and should not be taken as, an acknowledgment or any form of suggestion that that prior art forms part of the common general knowledge.

What is claimed is:

1. A control button for controlling operation of a machine, the control button comprising:
  an attachment member configured for attaching the control button to a surface of the machine so that the control button is operably connectable with the machine to control operation thereof;
  a display member comprising an electronic display module disposed thereon;
  an operational mode display controller operably connected to the electronic display module, the operational mode display controller being configured for controlling display of a plurality of operational modes of the machine upon the electronic display module in response to user interaction with the operational mode display controller; and
  an operational mode selector for controlling selection of one of the plurality of operational modes of the machine when one of the plurality of operational modes is displayed on the electronic display module, the operational mode selector being configured for depressible movement from at least an undepressed position into a depressed position, the depressible movement being configured to actuate selection of the operational mode displayed on the electronic display module, wherein the operational mode selector is biased towards the undepressed position by a return spring; and a printed circuit board including a microcontroller module for controlling operation of at least one of the electronic display module and the machine;

wherein the display member and the attachment member form a housing therebetween that encloses the printed circuit board and the return spring together therein to form an integrated unit in the control button.

2. The control button as claimed in claim 1, wherein the operational mode selector comprises the display member.

3. The control button as claimed in claim 1, wherein the operational mode selector is configured for at least one of tilting movement, pivoting movement, and sliding movement between at least the first position and the second position to actuate selection of the operational mode displayed on the electronic display module.

4. The control button as claimed in claim 1, wherein the display member includes an end surface upon which the electronic display module is disposed thereon and a sidewall extending substantially perpendicularly from an edge-region of the end surface.

5. The control button as claimed in claim 1, wherein the display member includes a square or rectangular-shaped configuration.

6. The control button as claimed in claim 1, wherein the operational mode display controller includes a touchpad device.

7. The control button as claimed in claim 1, further comprising a mechanism configured for vibrating the control button in response to the operational mode selector being moved to actuate selection of an operational mode of the machine.

8. The control button as claimed in claim 1, wherein the electronic display module is configured to output at least one of a predefined colour or brightness in response to the operational mode selector being moved to actuate selection of an operational mode of the machine.

9. The control button as claimed in claim 1, wherein the control button includes a sound emitter configured to output a predefined sound in response to the operational mode selector being moved to actuate selection of an operational mode of the machine.

10. The control button as claimed in claim 1, wherein the electronic display module includes a touchscreen display and whereby the touchscreen display is operable by a user to perform at least one of:
(a) displaying the plurality of operational modes of the machine; and
(b) selecting one of the plurality of operational modes when one of the plurality of operational modes is displayed on the electronic display module.

11. The control button as claimed in claim 1, wherein the operational mode selector includes a gripping surface disposed on the sidewall.

12. The control button as claimed in claim 1, wherein the operational mode selector comprises the display member.

13. The control button as claimed in claim 1, wherein the operational mode selector is configured for depressible movement from at least the undepressed position into the depressed position along a movement axis extending in a substantially perpendicular direction relative to the electronic display module.

14. The control button as claimed in claim 1, further comprising a wireless communication module configured for communication with a wireless communication module of an external device, the external device including at least one of (i) the machine (ii) a smartphone device, and (iii) a personal computer.

15. The control button as claimed in claim 14, wherein the wireless communication module includes at least one of a WI-FI® and a BLUETOOTH® type wireless communication module.

* * * * *